US009354441B2

(12) United States Patent
Iyad Al Dibs

(10) Patent No.: US 9,354,441 B2
(45) Date of Patent: May 31, 2016

(54) METHOD FOR ADAPTING THE PARAMETERS OF A CONTROLLER FOR MICROMECHANICAL ACTUATORS, AND DEVICE

(71) Applicant: Mohamad Iyad Al Dibs, Pliezhausen (DE)

(72) Inventor: Mohamad Iyad Al Dibs, Pliezhausen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/471,896

(22) Filed: Aug. 28, 2014

(65) Prior Publication Data

US 2015/0062681 A1  Mar. 5, 2015

(30) Foreign Application Priority Data

Aug. 28, 2013 (DE) .......................... 10 2013 217 093

(51) Int. Cl.
*G02B 26/08* (2006.01)
*B81B 3/00* (2006.01)
*B81C 99/00* (2010.01)

(52) U.S. Cl.
CPC .............. *G02B 26/0833* (2013.01); *B81B 3/00* (2013.01); *B81C 99/003* (2013.01)

(58) Field of Classification Search
CPC .............................. G02B 26/0833; B81B 3/00
USPC ........................................................ 359/221.2
See application file for complete search history.

(56) References Cited

U.S. PATENT DOCUMENTS

| 7,519,096 | B2 * | 4/2009 | Bouma et al. ................. 372/102 |
| 7,952,783 | B2 | 5/2011 | Holmes et al. |
| 8,905,553 | B2 * | 12/2014 | Lin et al. ......................... 353/85 |
| 2010/0182668 | A1 * | 7/2010 | Abe et al. ..................... 359/202.1 |
| 2011/0187297 | A1 * | 8/2011 | Guerra et al. ................. 318/119 |
| 2012/0081137 | A1 * | 4/2012 | Pagani et al. ............. 324/750.01 |

* cited by examiner

*Primary Examiner* — Frank Font
(74) *Attorney, Agent, or Firm* — Norton Rose Fulbright US LLP

(57) ABSTRACT

A method for adapting the parameters of a controller for micromechanical actuators, including the following steps: applying on the micromechanical actuator a test signal which has a step, detecting a test signal response of the micromechanical actuator to the test signal, identifying an absolute position of at least one mode in the detected test signal response, and adapting at least one of the parameters of the controller based on the identified absolute position of the at least one mode. Moreover, a corresponding device is described.

11 Claims, 9 Drawing Sheets

METHOD FOR ADAPTING THE PARAMETERS OF A CONTROLLER FOR MICROMECHANICAL ACTUATORS, AND DEVICE

FIELD OF THE INVENTION

The present invention relates to a method for adapting the parameters of a controller for micromechanical actuators, and a corresponding device.

BACKGROUND INFORMATION

Micromechanical actuators are presently used in a variety of applications. For example, micromirrors are used in projector units which are designed for a very small installation space.

In such projector units, micromirrors which represent a so-called microelectromechanical system (MEMS) are used. Such MEMS mirrors frequently have multiple mechanical resonance points, also referred to as modes or poles in the transfer function, which may be appropriately electrically excited. In addition, such MEMS mirrors also have anti-resonance modes, also referred to as zero points in the transfer function, or notches.

The modes of the MEMS mirrors are subdivided into useful modes and spurious modes. In particular, the excitation of spurious modes adversely affects the quality of the projected image.

The mentioned MEMS mirrors form a so-called inert spring-mass system, which in a first approximation may be modeled as a second-order low pass (PT2 element). The cutoff frequencies of the inert spring-mass system are defined by the first mode thereof.

Such an MEMS mirror may be operated either resonantly in one or multiple useful modes, or quasi-statically. The quasi-static actuation is carried out using a low-frequency signal, and avoids excitation of the modes.

Image formation with the aid of MEMS mirrors usually requires two MEMS mirrors, one of the MEMS mirrors being actuated resonantly, and one of the MEMS mirrors being operated quasi-statically. The MEMS mirror operated resonantly is responsible for the line projection of the image, and the MEMS mirror operated quasi-statically is responsible for the line-by-line image formation.

An MEMS mirror is typically actuated using a sawtooth signal to generate a frame rate of 60 Hz, for example. In the frequency range, the sawtooth signal contains the multiples of the even and uneven harmonics of the fundamental frequency. Two possible sawtooth signals having different return times are illustrated in the diagram in FIG. 11 as dashed and solid curves. Time is plotted on the x-axis, and the amplitude of the sawtooth signal is plotted on the y-axis. FIG. 11 shows the rising edges of those edges which guide the MEMS mirror line by line. The falling edges represent the return of the MEMS mirror into its initial position. FIG. 12 illustrates the corresponding sawtooth signal in the frequency range.

Linear drivers or digital drivers are customarily used for actuating the MEMS mirrors in the quasi-static state. To achieve sufficient accuracy in the actuation or to increase the linear deflection, the micromirrors are actuated in a closed control loop. Various controllers, for example adaptive PD controllers, current controllers, and position controllers in a feed forward structure, LMS harmonic controllers, iterative harmonic coefficient determination, and the like may be used.

The controllers which are used share the common feature that they require a very large system bandwidth, and therefore very high computing power.

A control system which operates according to the iterative harmonic coefficient determination method is provided in U.S. Pat. No. 7,952,783.

A large system bandwidth and a high computing power mean a large space requirement, for example for analog-digital converters, microcontrollers, digital-analog converters, driver stages, and the like, in the actuating ICs.

For example, systems having MEMS mirrors and controllers typically require a controller bandwidth of 1 MHz in order to accurately control each scan line. In addition, some of the known controller designs require additional pieces of status information concerning the MEMS mirror, which in reality are very difficult to detect or estimate.

In addition, modular multiple feedback controllers which have a simple design may be used for actuating an MEMS mirror.

Such modular multiple feedback controllers are less complex than other controller structures, and may therefore be implemented very easily, for example, in an ASIC or in software, for example as a program in a DSP or microcontroller.

The modular multiple feedback controllers for various MEMS mirrors are appropriately parameterized for achieving the best possible performance.

SUMMARY

The present invention provides a method for adapting the parameters of a controller for micromechanical actuators, and a device for adapting the parameters of a controller for a micromechanical actuator.

Accordingly, the following is provided:

A method for adapting the parameters of a controller for micromechanical actuators, including the following steps: applying on the micromechanical actuator a test signal which has a step and/or a pulse and/or a frequency sweep, detecting a test signal response (for example, a step response or pulse response) of the micromechanical actuator to the test signal, identifying an absolute position of at least one mode in the detected test signal response, and adapting at least one of the parameters of the controller based on the identified absolute position of the at least one mode.

Moreover, the present invention provides the following:

A device for adapting the parameters of a controller for a micromechanical actuator, including a signal generator which is designed for outputting a test signal, which has a step and/or a pulse and/or a frequency sweep, to the micromechanical actuator, including a detector which is designed for detecting a test signal response of the micromechanical actuator to the test signal, including an analyzer which is designed for identifying an absolute position of at least one mode in the detected test signal response, and including an adapter which is designed for adapting at least one of the parameters of the controller based on the identified absolute position of the at least one mode.

The present invention is based on the finding that a controller module, for example a modular multiple feedback controller, is adapted to the particular micromechanical actuator to be actuated in order to achieve the best possible performance or to allow the best possible control.

The concept underlying the present invention is to take this finding into account and provide an option for very easily determining the parameters of a controller which is used to control a micromechanical actuator.

For this purpose, the present invention provides that a micromechanical actuator without a controller connected upstream is acted on by a test signal which has a signal step, a signal pulse, or a frequency sweep.

When such a micromechanical actuator is acted on by a test signal according to the present invention, the micromechanical actuator is deflected, thus generating a measurable test signal response to the test signal.

The present invention now provides for detecting and evaluating this test signal response.

In particular, the present invention provides for identifying an absolute position of at least one mode in the detected test signal response, and adapting the at least one parameter of the controller based on this detected absolute position of the at least one mode.

Adapting the parameters of the particular controller for the particular micromechanical actuator used results in a very high-quality controller performance with high control quality.

For example, all technology-related fluctuations between individual micromechanical actuators may be compensated for with the aid of the present invention, and a high level of robustness of the overall system may be achieved.

In one specific embodiment, the further step of determining a relative position of the modes with respect to one another in the detected test signal response is provided, in the adaptation, the at least one parameter being adapted based on the identified absolute position of the at least one mode and/or the relative position of the modes with respect to one another in the detected test signal response. This allows a precise adaptation of the parameters to the particular micromechanical actuator.

In one specific embodiment, the further step of detecting at least one phase rotation or at least one phase shift in the frequency response of the micromechanical actuator based on the detected test signal response is provided, in the adaptation, the at least one parameter being adapted based on the identified absolute position of the at least one mode and/or the relative position of the modes with respect to one another in the detected test signal response and/or the detected phase rotations or the detected phase shifts. This allows the parameters of the particular controller to be adjusted with even greater accuracy.

In one specific embodiment, the further step of determining in each case an attenuation factor for each of the modes based on the detected test signal response is provided, in the adaptation, the at least one parameter being adapted based on the identified absolute position of the at least one mode and/or the relative position of the modes with respect to one another in the detected test signal response and/or the detected phase rotations or the detected phase shifts and/or the determined attenuation factors. Very simple and accurate adjustment of the parameters of the particular controllers is thus possible.

In one specific embodiment, the further step of transforming the detected test signal response into the frequency range is provided, the identification of the absolute position of at least one mode and/or the determination of the relative position of the modes with respect to one another and/or the detection of a phase rotation or a phase shift and/or the determination of the attenuation factor for each of the modes being carried out based on the transformed test signal response in the frequency range. This allows very simple, less complex analysis of the test signal response.

In one specific embodiment, the further steps of applying on the micromechanical actuator, together with the controller in a closed control loop, a test signal which has a step and/or a pulse and/or a frequency sweep, detecting the system response to the test signal, and checking the system stability based on the detected system response are provided. It is thus possible to check the correctness of the adapted parameters and to repeat the adaptation of the parameters if necessary.

In another specific embodiment, the parameters of individual elements of the controllers may be parameterized in such a way that these elements are completely switched off, or switched on or off in a targeted manner. For example, this may be carried out by an appropriate adaptation of the parameters. This allows the controller structure to be adapted to the particular micromechanical actuator.

In another specific embodiment, in addition to the parameters of the controllers, filters may be determined or computed which may be used to filter input signals and output signals of the controllers. Such filters may be low pass filters, high pass filters, or band pass filters, for example.

The above embodiments and refinements may be arbitrarily combined with one another if this is meaningful. Other possible embodiments, refinements, and implementations of the present invention also include combinations, even if not explicitly stated, of features of the present invention described above or below with regard to the exemplary embodiments. In particular, those skilled in the art will also add individual aspects as enhancements or supplements to the particular basic form of the present invention.

BRIEF DESCRIPTION OF THE DRAWINGS

Unless indicated otherwise, identical or functionally equivalent elements and devices have been provided with the same reference numerals in all the figures.

DETAILED DESCRIPTION

Figure 1:
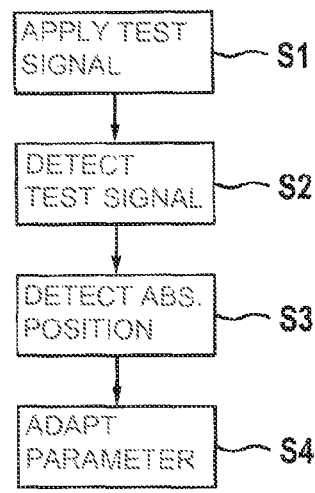
FIG. 1 shows a flow chart of one specific embodiment of the method according to the present invention.

FIG. 1 shows a flow chart of one specific embodiment of the method according to the present invention.

In a first step S1, the method provides for applying on micromechanical actuator 3 a test signal 5 which has a step and/or a pulse and/or a frequency sweep 6.

A second step S2 provides for detecting a test signal response 8 of micromechanical actuator 3 to test signal 5.

An absolute position 10 of at least one mode 11-1 through 11-3 in detected test signal response 8 is detected in a third step S3.

Lastly, fourth step S4 provides for adapting at least one of parameters 13-1 through 13-*n* of controller 2 based on identified absolute position 10 of the at least one mode 11-1 through 11-3.

The interaction or the correlation between controller parameters and parameters of the micromechanical actuator as a controlled system may, for example, be mathematically or experimentally derived by those skilled in the art in order to obtain the best possible results.

Figure 2:
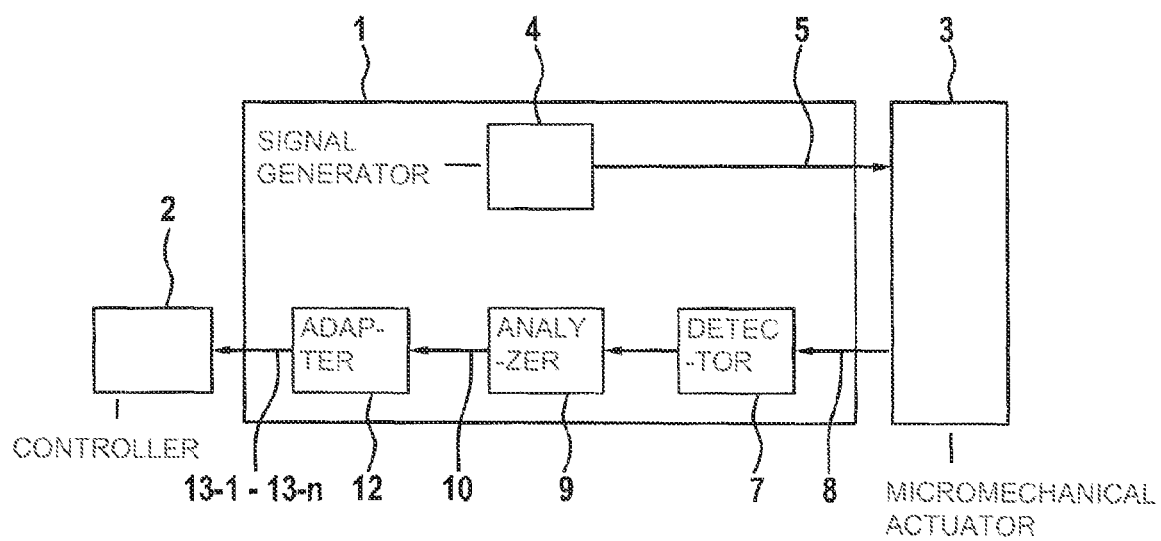
FIG. 2 shows a block diagram of one specific embodiment of the device according to the present invention.

FIG. 2 shows a block diagram of one specific embodiment of device 1 according to the present invention.

Device 1 has a signal generator 4 which outputs a test signal 5, having a step and/or a pulse and/or a frequency sweep 6, to micromechanical actuator 3.

In addition, a detector 7 is provided which detects a test signal response 8 of micromechanical actuator 3 to test signal 5.

Detector 7 outputs detected test signal response 8 to an analyzer 9, which identifies an absolute position 10 of at least one mode 11-1 through 11-3 in detected test signal response 8.

Lastly, an adapter 12 is provided which adapts at least one of parameters 13-1 through 13-*n* of controller 2 based on identified absolute position 10 of the at least one mode 11-1 through 11-3.

In another specific embodiment, analyzer 9 may be designed for analyzing further variables in test signal response 8. For example, analyzer 9 may identify relative position 14 of modes 11-1 through 11-3 with respect to one another in detected test signal response 8, or may identify at least one phase rotation 15-1 or at least one phase shift 16-1 through 16-2 in the frequency response of micromechanical actuator 3 based on detected test signal response 8.

Analyzer 9 may, for example, also identify in each case an attenuation factor 17 for modes 11-1 through 11-3 based on detected test signal response 8.

In such specific embodiments, adapter 12 is able to adapt parameters 13-1 through 13-*n* of controller 2 based on the variables which are additionally analyzed from detected test signal response 8.

Figure 3:
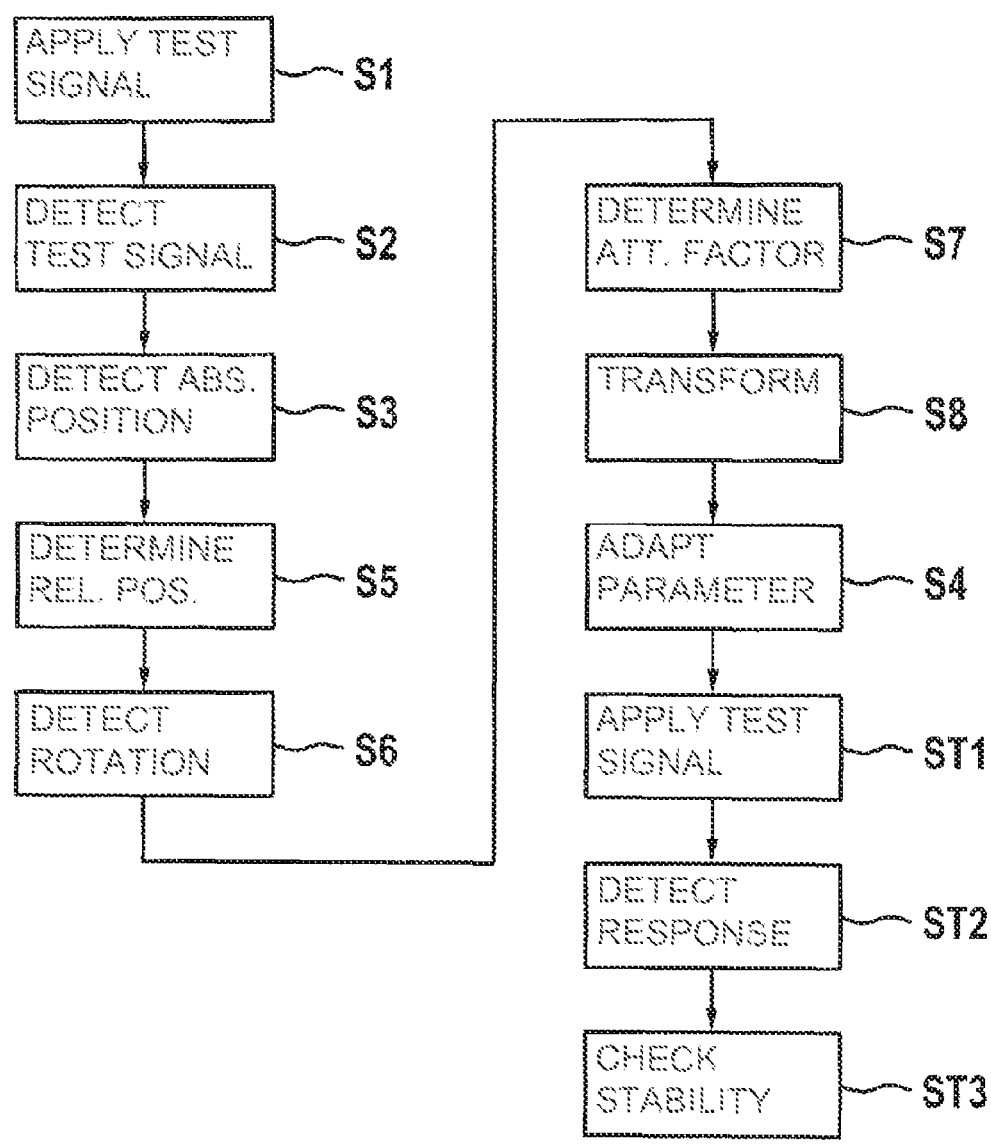
FIG. 3 shows a flow chart of another specific embodiment of the method according to the present invention.

FIG. 3 shows a flow chart of another specific embodiment of the method according to the present invention.

The method in FIG. 3 is based on the method in FIG. 1, and has further steps S5 through S8 which are provided between steps S3 and S4. In addition, steps ST1 through ST3 are provided after step S4.

Step S5 provides for determining a relative position 14 of modes 11-1 through 11-3 with respect to one another. Detecting S6 at least one phase rotation 15-1 or at least one phase shift 16-1 through 16-2 in the frequency response of micromechanical actuator 3 based on detected test signal response 8 is provided in step S6. In step S7, in each case an attenuation factor 17 for each of modes 11-1 through 11-3 is determined based on detected test signal response 8.

Lastly, detected test signal response 8 is transformed into the frequency range in an eighth step S8.

In addition, adaptation S4 of parameters 13-1 through 13-*n* based on identified absolute position 10 of the at least one mode 11-1 through 11-3 and/or relative position 14 of modes 11-1 through 11-3 with respect to one another in detected test signal response 8 and/or detected phase rotations 15-1 or the detected phase shifts and/or determined attenuation factors 17 is carried out.

Lastly, test steps ST1 through ST3 are provided, the first step providing for applying on ST1 micromechanical actuator 3 together with controller 2 in a closed control loop a test signal which has a step and/or a pulse and/or a frequency sweep 6.

In addition, the system response to the test signal is detected in step ST2, and the system stability is checked, based on the detected system response, in step ST3.

Figure 4:
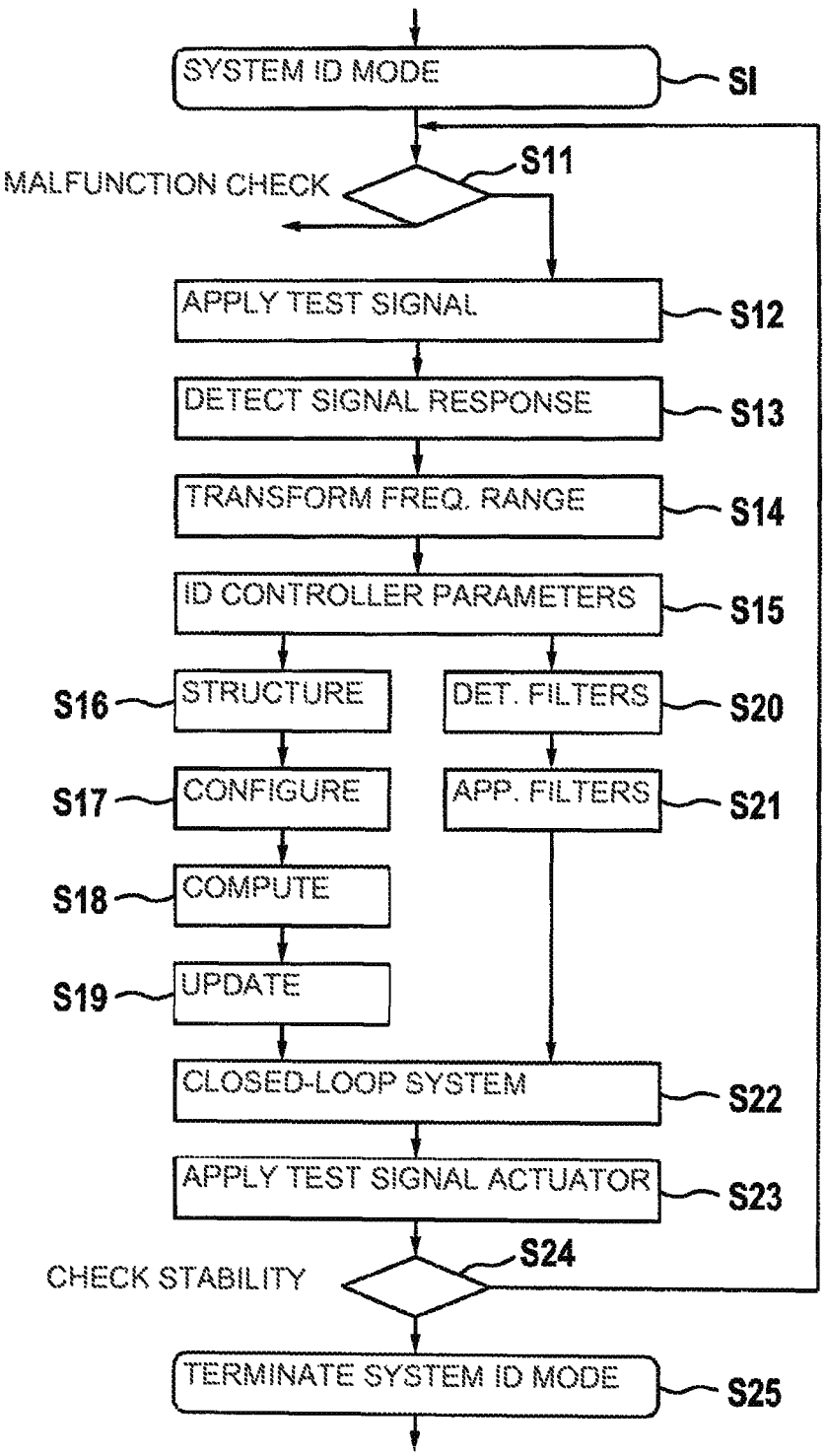
FIG. 4 shows a flow chart of another specific embodiment of the method according to the present invention.

FIG. 4 shows a flow chart of another specific embodiment of the method according to the present invention.

A system identification mode is started in step SI in which the parameters of the particular controller 2 may be adapted and checked.

A check is made in a step S11 as to whether micromechanical actuator 3 has a malfunction. If this is the case, the system identification mode is terminated. If no malfunction is present, in step S12 micromechanical actuator 3 is excited by a test signal which has a step and/or a pulse and/or a frequency sweep. Micromechanical actuator 3 is in a so-called open loop mode. This means that there is no feedback between micromechanical actuator 3 and the controller.

Test signal response 8 of the micromechanical actuator to the test signal is detected in step S13. Detected test signal response 8 is transformed into the frequency range in step S14. This may take place using a fast Fourier transformation (FFT), for example. Step S15 provides for identifying relevant parameters 13-1 through 13-*n* of controller 2. The transfer function or a model of controller 2, for example, may be present for this purpose.

Figure 9:
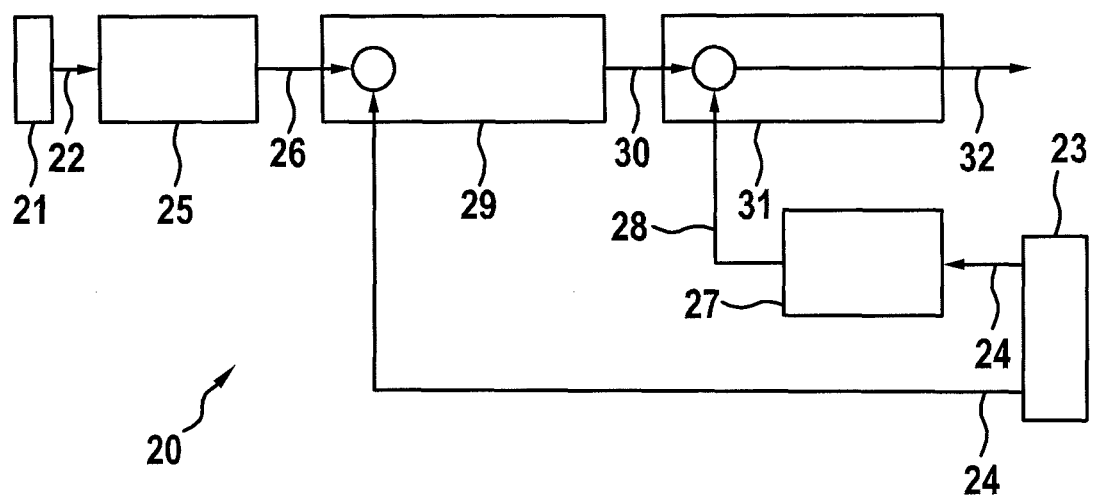
FIG. 9 shows a block diagram of a modular multiple feedback controller.
Figure 10:
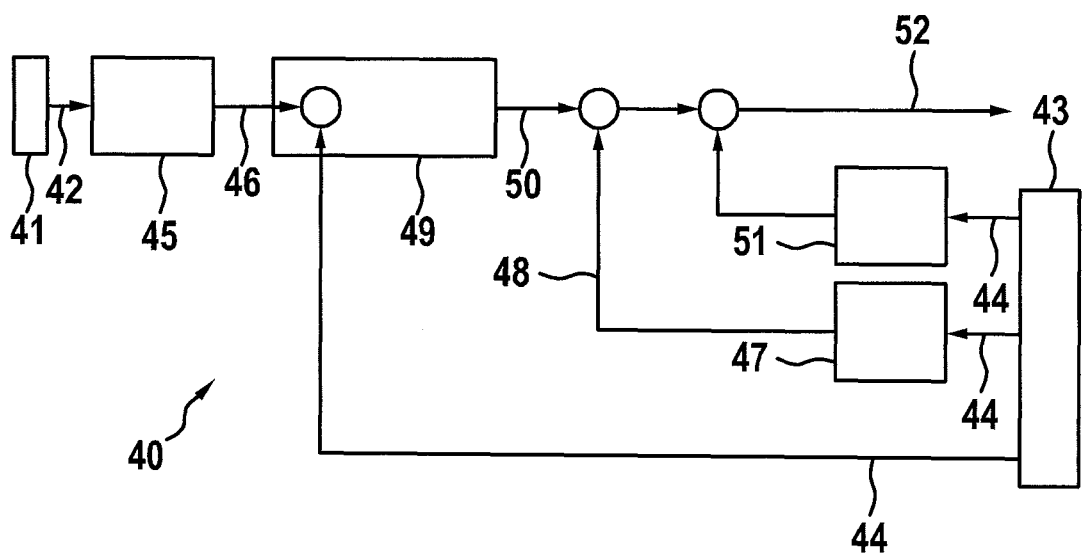
FIG. 10 shows a block diagram of another modular multiple feedback controller.
Figure 11:
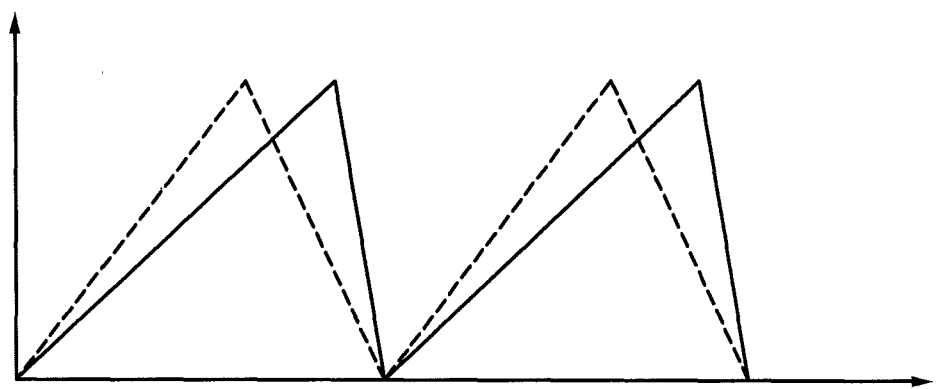
FIG. 11 shows possible sawtooth signals for actuating an MEMS mirror in the time range.
Figure 12:
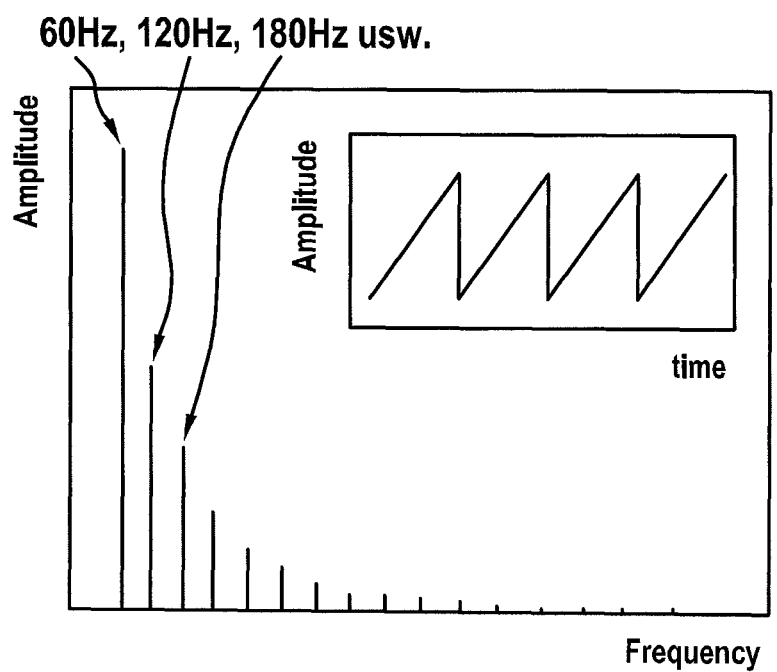
FIG. 12 shows one possible sawtooth signal for actuating an MEMS mirror in the frequency range.

The controller structure is subsequently determined in step S16, and an appropriate controller structure for the particular micromechanical actuator 3 is configured in step S17. Possible controller structures are illustrated in FIG. 9 and FIG. 10, for example. Parameters 13-1 through 13-*n* for the particular controller structure are computed in step S18, and parameters 13-1 through 13-*n* are updated in controller 2 in step S19.

At the same time as the determination of parameters 13-1 through 13-*n*, a determination of filters which may be needed for filtering the input signals or output signals of controller 2 takes place in step S20. Such filters may be high pass filters, low pass filters, or band pass filters, for example. The appropriate filters in the controller are activated or deactivated in step S21.

Lastly, it is provided in step S22 that micromechanical actuator 3 together with corresponding controller 2 is put into a closed-loop system, i.e., the micromechanical actuator together with controller 2 is operated in a closed control loop.

Micromechanical actuator 3 is now acted on by a test signal in step S23, and a check is made in step S24 as to whether the overall system is stable and has the desired system characteristic.

If the overall system is unstable or does not have the desired system characteristic, the method may be carried out again.

If the overall system is stable and has the desired system characteristic, the system identification mode is terminated in step S25.

Figure 5:
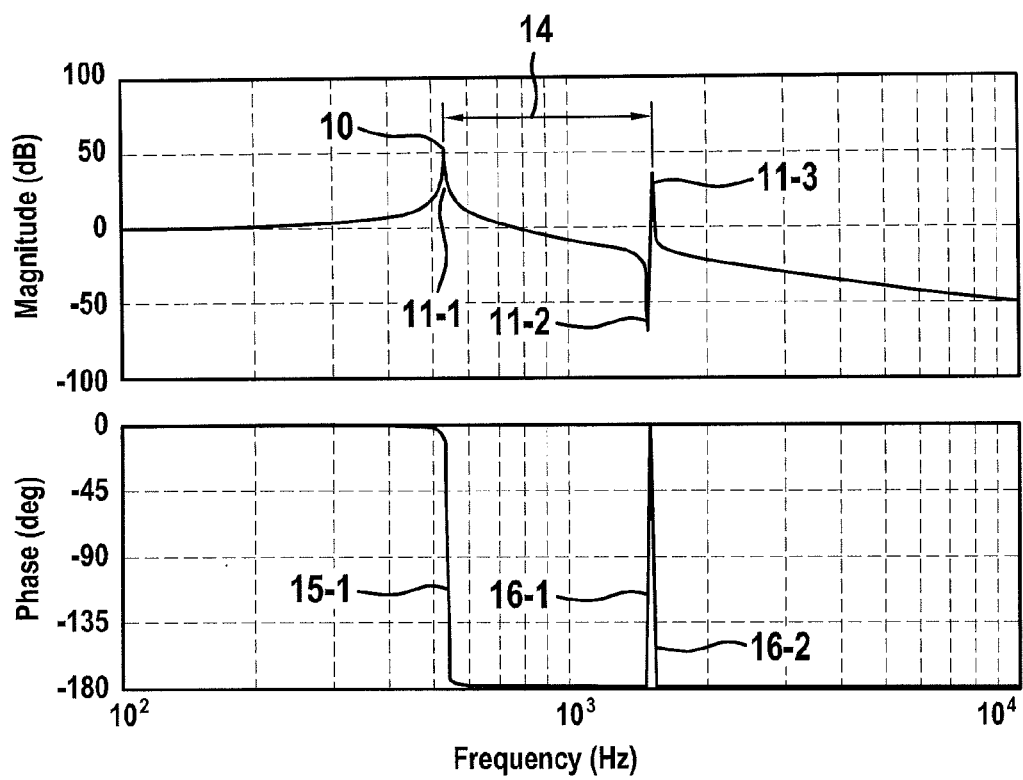
FIG. 5 shows a Bode plot for a micromechanical actuator.

FIG. 5 shows a Bode plot for a micromechanical actuator 3, which may be a micromirror, for example.

The Bode plot has two individual diagrams situated one on top of the other. In each case the frequency is logarithmically plotted on the x-axis of the diagram. The attenuation of micromirror 3 in dB at the particular frequency is plotted on the y-axis of the top diagram. The phase of the output signal of micromirror 3 at the particular frequency is represented on the y-axis of the bottom diagram.

In the top diagram, the curve begins at approximately 0 dB and extends in an approximately parabolic shape to a frequency of approximately 550 Hz, where it has a local maximum 10, i.e., a first resonance mode 11-1, having an absolute value of approximately 50 dB. From approximately 550 Hz to just under 700 Hz, the attenuation drops to approximately 0 dB, and, having the approximate shape of a parabola which is open downward, at 1.6 kHz drops to approximately −70 dB, where anti-resonance mode 11-2 is situated, after which it immediately rises steeply to approximately 40 dB, where second resonance mode 11-3 is situated. From there, the signal drops rapidly to approximately −10 dB, and then extends linearly to −50 dB until the end of the diagram at 10 kHz.

In the bottom diagram, the phase extends at 0° to approximately 500 Hz and then drops steeply in the first resonance mode to −180°. This is a phase rotation 15-1. As a result of anti-resonance mode 11-2 and resonance mode 11-3 at approximately 1.6 kHz, the phase rises briefly with a phase shift 16-1 to 0°, and with a second phase shift 16-2 drops back to −180°.

It is apparent from the diagram in FIG. 5 how a resonance mode results in a phase shift of −180°. It is also apparent that an anti-resonance mode in this micromirror results in the opposite, a phase shift by +180°.

Figure 6:
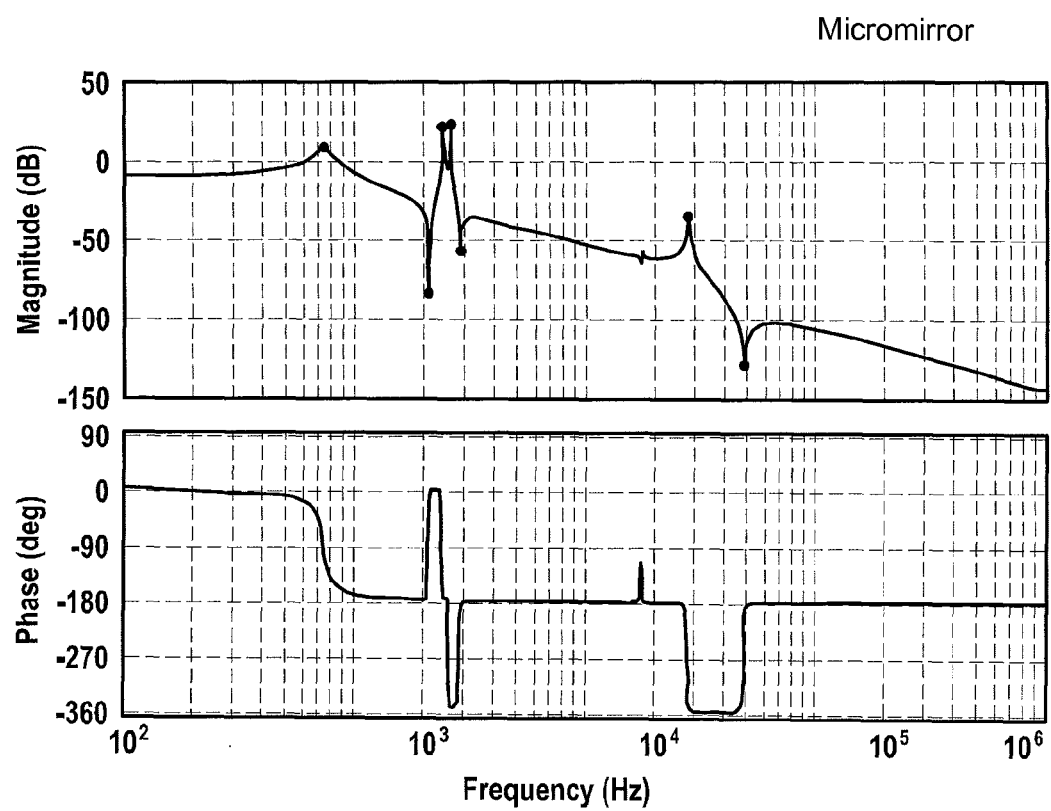
FIG. 6 shows a Bode plot for another micromechanical actuator.

FIG. 6 shows a Bode plot for another micromechanical actuator 3.

The Bode plot likewise has two individual diagrams situated one on top of the other. In each case the frequency is once again logarithmically plotted on the x-axis of the diagram. The attenuation of micromirror 3 in dB at the particular frequency is plotted on the y-axis of the top diagram. The phase of the output signal of micromirror 3 at the particular frequency is represented on the y-axis of the bottom diagram.

In the top diagram, the curve begins at approximately −5 dB, and at a frequency of 741 Hz has a local maximum, i.e., a first resonance mode, having an absolute value of 8.19 dB. From 741 Hz to just prior to 2.1 kHz, the attenuation drops to approximately −30 dB, and at 2.1 kHz drops to −83.8 dB (first anti-resonance mode), and at 2.4 kHz rises to 20.5 dB (second resonance mode). Between 2.4 kHz and 2.6 kHz, the attenuation drops to approximately −3 dB, and at 2.6 kHz rises to 21.9 dB (third resonance mode) until 2.87 kHz, where it drops back to −56.3 dB (second anti-resonance mode). Immediately after reaching 2.87 kHz, the attenuation rises to approximately −30 dB, and at approximately 10.9 kHz then drops once again to approximately −56 dB (third anti-resonance mode), then rises immediately to approximately −53 dB, where it extends in an approximate parabolic shape to 28 kHz and −35.8 dB (fifth resonance mode), and at 49.2 kHz drops to −128 dB. From there, the signal rises to approximately −100 dB, and drops to approximately −140 dB until the end of the diagram at 1 MHz.

In the bottom diagram, the phase extends at 0° to approximately 400 Hz, and at 741 Hz then drops to −90°, to approximately 1 kHz, where it drops to −180°. At 2.1 kHz the phase rises to 0°, and at 2.4 kHz the phase drops to −180°, whereupon at 2.6 kHz it drops to −360°, and at 2.87 kHz once again rises to −180°. At approximately 10.9 kHz the phase response has a peak at approximately −100°, extends to 28 kHz at −180°, and between 28 kHz and 49.2 kHz drops to −360°, after which it extends at −180° until the end of the diagram.

The diagram in FIG. 6 clearly shows the phase shift from −180° to −360° which a micromirror 25 has when two modes are followed by an anti-resonance mode in the Bode plot of micromirror 25.

It is clear from FIGS. 5 and 6 that different micromechanical actuators 3, for example micromirrors 3, may have very different behavior characteristics. For example, the micromirror in FIG. 5 has only phases of 0° to −180°, while micromirror 3 in FIG. 6 has phases between 0° and −360°.

The present invention provides an option for compensating for these different behavior characteristics of micromirrors 3 by determining the parameters of the particular controller 2 based on test signal response 8 of the particular micromirror 3. This is explained in greater detail in conjunction with FIG. 8.

Figure 7:
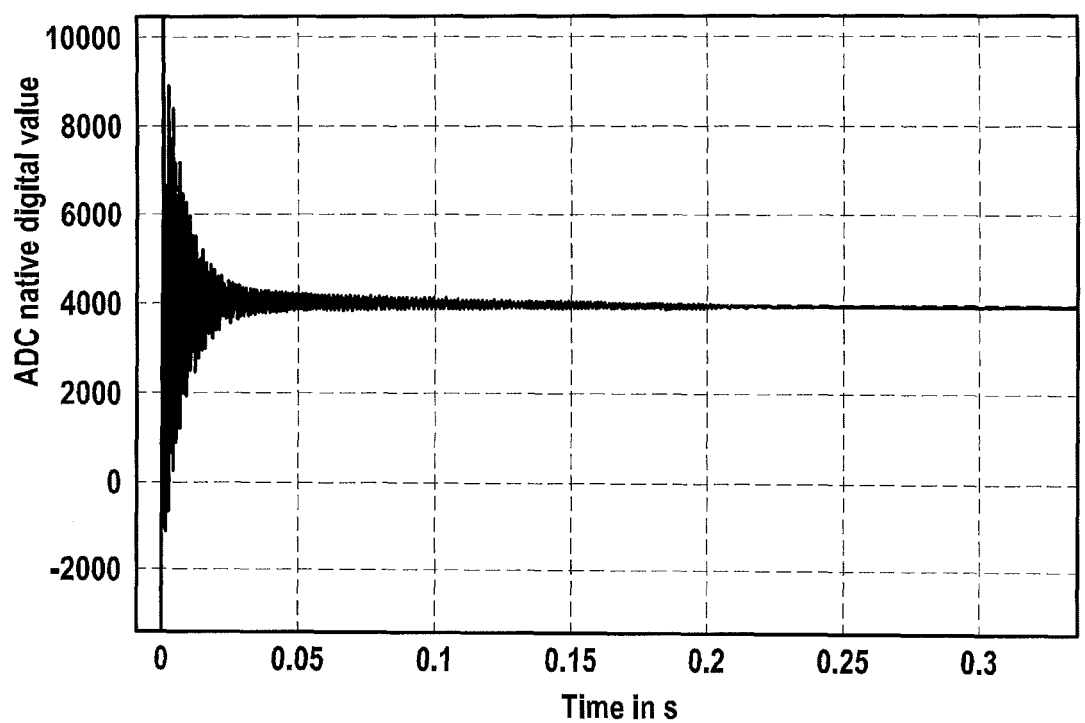
FIG. 7 shows a test signal response of a micromechanical actuator in the time range.

FIG. 7 shows a test signal response 8 of a micromechanical actuator in the time range.

The x-axis of the diagram shows the time in seconds from approximately −0.01 s to 0.33 s. The y-axis shows a dimensionless raw value of an analog-digital converter which records the deflection of micromechanical actuator 3.

The signal has oscillations at all frequencies or frequency components of the micromirror, and at 0 s begins to oscillate about the signal midpoint of 4000 at its maximum amplitude of approximately 6000. The amplitude of the signal drops exponentially, and at 0.05 s is already only approximately 4000.

Recorded test signal response 8 makes an analysis in the time range very difficult, since the characteristic values are extractable only with difficulty. Therefore, this test signal response 8 is transformed into the frequency range, as explained in greater detail in conjunction with FIG. 8.

Figure 8:
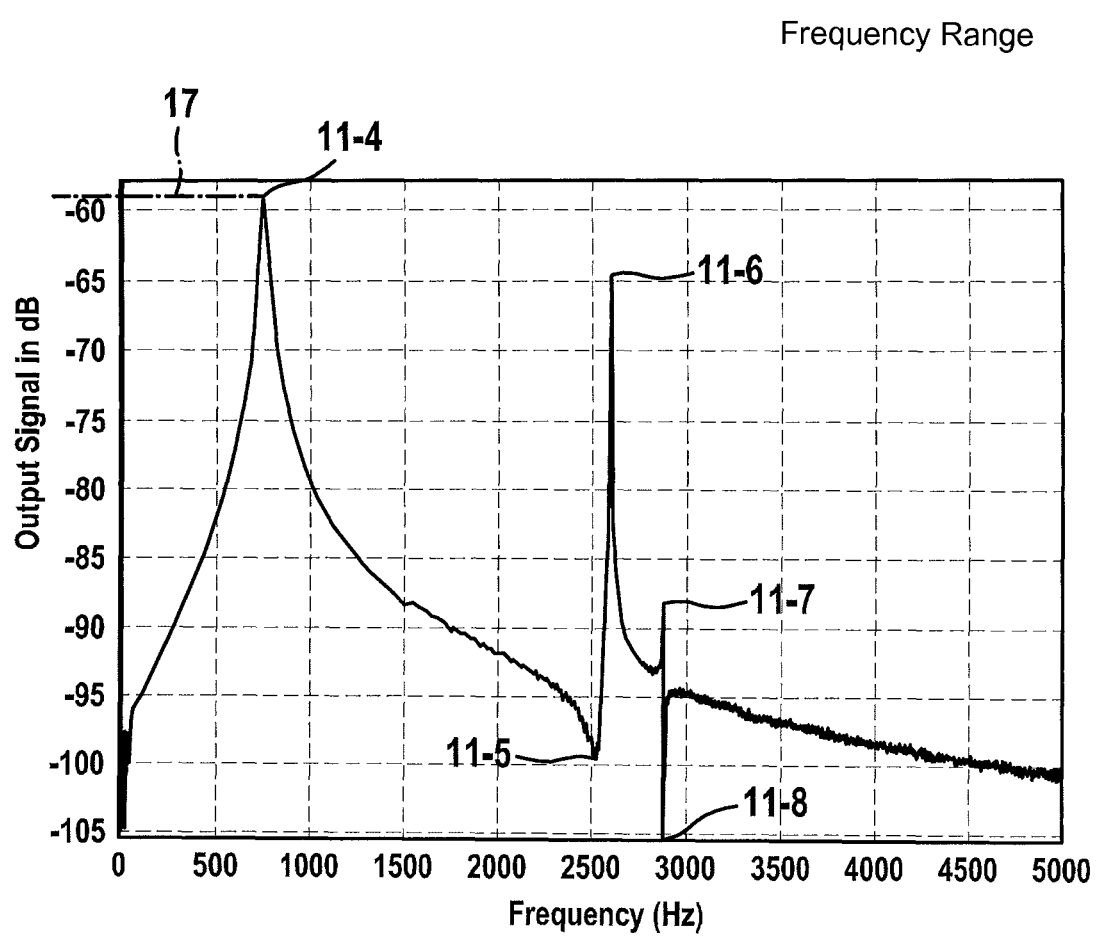
FIG. 8 shows the test signal response from FIG. 7 in the frequency range.

FIG. 8 shows test signal response 8 from FIG. 7 in the frequency range. The attenuation is plotted as a function of time. The frequency extends from 0 Hz to 5000 Hz. The attenuation extends from −55 dB to −105 dB.

The attenuation curve begins at 0 Hz at approximately −100 dB, and at approximately 750 Hz rises to approximately −57 dB, where first resonance mode 11-4 of micromechanical actuator 3 in question is situated. From first resonance mode 11-4, at approximately 2550 Hz the signal drops to −99 dB, where first anti-resonance mode 11-5 is situated. Second resonance mode 11-6 is situated at approximately 2600 Hz, where the attenuation rises to −65 dB, and then drops to −97 dB until reaching approximately 2900 Hz, where it once again rises to third resonance mode 11-7 at −87 dB. Immediately afterwards, the attenuation drops to −105 dB at second anti-resonance mode 11-8 and once again rises to −95 dB. From there, the attenuation drops evenly to −100 dB at the end of the diagram.

The transfer function of the micromechanical actuator is a function of, and varies according to, the particular micromechanical construction and its properties. This transfer function may be expressed as follows:

$$G(s) = \frac{\left(\frac{1}{(2*pi*f02b)^2}*s^2 + 2*\frac{D02b}{2*pi-f02b}*s + 1\right)*ks02*ks01}{ks03*\left(\frac{1}{(2*pi*f01)^2}+s^2+2*\frac{D01}{2*pi*f01}*s+1\right)*\left(\frac{1}{(2*pi*f02)^2}*s^2+2*\frac{D02}{2*pi*f02}*s+1\right)}$$

where
D01: attenuation factor of the first mode
D02: attenuation factor of the second mode
D02b: attenuation factor of the second anti-resonance mode
f01: frequency of the first mode
f02: frequency of the second mode
f02b: frequency of the third mode
ks01: component of mode 1 at the DC gain of the transfer function ks02: component of mode 2 at the DC gain of the transfer function ks03: component of mode 3 at the DC gain of the transfer function The interaction or the correlation between the controller parameters and the parameters of the micromechanical actuator as a controlled system may, for example, be mathematically or experimentally derived by those skilled in the art in order to achieve the best possible properties of the closed control loop.

FIG. 9 shows a block diagram of a modular multiple feedback controller 1.

Controller 20 has a first signal input 21 which is coupled to a first controller element 25. First controller element 25 is coupled to a third controller element 29, which is coupled to a fourth controller element 31.

In addition, a second signal input 23 is provided which transmits a received measuring signal 24 to a second controller element 27 and to third controller element 29. Received measuring signal 24 characterizes a recorded response of micromechanical actuator 3 to a control signal 32. Second controller element 27, which modifies received measuring signal 24 by minimizing, i.e., attenuating, the quality of first mode 11-1 of received measuring signal 24, is connected downstream from second signal input 23.

First signal input 21 is designed for receiving a reference signal 22 and transmitting it to first controller element 25, which filters out or attenuates predefined frequency modes and/or predefined frequency components from received reference signal 22.

First controller element 25 of controller 20 may be designed as a digital filter unit, for example as an IIR filter, a notch filter, or an FIR filter, and is used to eliminate, attenuate, or suppress undesirable frequency modes or frequency components in the reference variable of reference signal 22.

Second controller element 27 may minimize the quality of the first mode of micromechanical actuator 3 in the closed control loop via received measuring signal 24. In one specific embodiment, second filter element 27 may shift the complex poles of the first mode of micromechanical actuator 3 in the closed control loop by processing measuring signal 24 in the direction of the real axis of the pole-zero plot. This corresponds to an increase in the attenuation of the mode. In addition, second controller element 27 may eliminate the pole of the first mode of measuring signal 24, and may introduce a new pole having a changed attenuation factor, for example, 0.707.

In one specific embodiment, the quality factor of the second or higher modes may be minimized by additional feedback of one or multiple pieces of frequency information.

In one specific embodiment, the attenuation factor of the second or higher modes may be increased by additional feedback of one or multiple pieces of frequency information.

Third controller element 29 is the actual core of controller 20, and minimizes the deviation between filtered and/or attenuated reference signal 26 and received measuring signal 24.

Third controller element 29 outputs minimized reference signal 30 to fourth controller element 31.

Third controller element 29 may be a PID controller, for example.

Fourth controller element 31 rotates the phase of the difference between minimized reference signal 30 and modified measuring signal 28 for at least one predefined frequency or for a predefined frequency range. The rotated measuring signal is transmitted as control signal 32 to micromechanical actuator 3.

Fourth controller element 31 is used for phase inversion or phase rotation, for example, when the transfer function of the micromechanical actuator used has two successive resonance modes which are followed by an anti-resonance mode.

FIG. 10 shows a block diagram of another modular multiple feedback controller 40.

Controller 40 has a first signal input 41 which is coupled to a first controller element 45. First controller element 45 is coupled to a third controller element 49.

In addition, a second signal input 43 is provided which transmits a received measuring signal 44 to a second controller element 47, to a fourth controller element 51, and to third controller element 49. Received measuring signal 44 characterizes a recorded response of micromechanical actuator 3 to a control signal 52. Second controller element 47 and fourth controller element 51, which modify received measuring signal 44, are connected downstream from second signal input 43. Second controller element 47 minimizes, i.e., attenuates, the quality of the first mode of received measuring signal 44. Fourth controller element 51 adjusts the bandwidth of received measuring signal 44.

First signal input 41 is designed for receiving a reference signal 42 and transmitting it to first controller element 45, which filters out or attenuates predefined frequency modes and/or predefined frequency components from received reference signal 42 and outputs filtered and/or attenuated reference signal 46.

First controller element 45 of controller 40 may be designed as a digital filter unit, for example as an IIR filter, a notch filter, or an FIR filter, and is used to eliminate, attenuate, or suppress undesirable frequency modes or frequency components in the reference variable of reference signal 42.

Second controller element 47 may minimize the quality of the first mode of micromechanical actuator 3 in the closed control loop by processing measuring signal 44. In one specific embodiment, second filter element 47 may shift the complex poles of the first mode of micromechanical actuator 3 by processing measuring signal 44 in the direction of the real axis of the pole-zero plot of the closed control loop. This corresponds to an increase in the attenuation of the mode. In addition, second controller element 47 may eliminate the pole of the first mode of micromechanical actuator 3 by processing measuring signal 44, and may introduce a new pole having a changed attenuation factor, for example, 0.707.

In one specific embodiment, the quality factor of the second or higher modes of micromechanical actuator 3 may be minimized by additional feedback of one or multiple pieces of frequency information.

In one specific embodiment, the attenuation factor of the second or higher modes of the MEMS element may be increased by additional feedback of one or multiple pieces of frequency information.

Second controller element 47 has a transfer function at least of the first order, and may have an order which is even or odd.

Third controller element 49 is the actual core of controller 40, and minimizes the deviation between filtered and/or attenuated reference signal 46 and received measuring signal 44. Third controller element 49 outputs minimized reference signal 50 as control signal 52. Modified measuring signal 48 and received measuring signal 44 are subtracted from control signal 52 before it is transmitted to micromechanical actuator 3.

Third controller element 10 may be a PID controller, for example.

Fourth controller element 51 is used to adjust the bandwidth of micromechanical actuator 3 in the closed control loop by processing received measuring signal 44, and thus, the overall system composed of micromechanical actuator 3 and controller 40. For example, the bandwidth of the overall system may be increased or decreased.

What is claimed is:

1. A method for adapting parameters of a controller for a micromechanical actuator, comprising:
    applying a test signal on the micromechanical actuator that includes at least one of a step, a pulse, and a frequency sweep;
    detecting a test signal response of the micromechanical actuator to the test signal;
    identifying an absolute position of at least one mode in the detected test signal response; and
    adapting at least one of the parameters of the controller based on the identified absolute position of the at least one mode.

2. The method as recited in claim 1, further comprising:
    determining a relative position of modes with respect to one another in the detected test signal response, wherein, in the adapting step, the at least one of the parameters is adapted based on at least one of the identified absolute position of the at least one mode and a relative position of the modes with respect to one another in the detected test signal response.

3. The method as recited in claim 1, further comprising:
    detecting one of at least one phase rotation and at least one phase shift in a frequency response of the micromechanical actuator based on the detected test signal response, wherein, in the adapting step, the at least one parameter is adapted based on at least one of the identified absolute position of the at least one mode and a relative position of the modes with respect to one another in at least one of the detected test signal response and one of the detected phase rotation and the detected phase shift.

4. The method as recited in claim 3, further comprising:
    determining in each case an attenuation factor for each of the modes based on the detected test signal response, wherein, in the adapting step, the at least one parameter is adapted based on at least one of the identified absolute position of the at least one mode, a relative position of the modes with respect to one another in the detected test signal response, one of the detected phase rotation and the detected phase shift, and the determined attenuation factor.

5. The method as recited in claim 4, further comprising:
    transforming the detected test signal response into a frequency range, wherein at least one of the identifying of the absolute position of at least one mode, the determining of the relative position of the modes with respect to one another, the detecting of one of the phase rotation and thte phase shift, and the determining of the attenuation factor for each of the modes is carried out based on the transformed test signal response in the frequency range.

6. The method as recited in claim 1, further comprising:
    detecting a system response to the test signal; and
    checking a system stability based on the detected system response;
    wherein the test signal has a step, and wherein the test signal is applied on the micromechanical actuator, together with the controller in a closed control loop.

7. A device for adapting parameters of a controller for a micromechanical actuator, comprising:
    a signal generator for outputting a test signal that has at least one of a step, a pulse, and a frequency sweep, to the micromechanical actuator;
    a detector for detecting a test signal response of the micromechanical actuator to the test signal;
    an analyzer for identifying an absolute position of at least one mode in the detected test signal response; and
    an adapter for adapting at least one of the parameters of the controller based on the identified absolute position of the at least one mode.

8. The device as recited in claim 7, wherein:
    the at least one mode includes modes,
    the analyzer identifies relative positions of the modes with respect to one another in the detected test signal response, and
    the adapter adapts the at least one parameter of the controller based on the absolute positions of the at modes and the relative positions of the modes with respect to each other in the detected test signal response.

9. The device as recited in claim 7, wherein:
    the analyzer identifies one of at least one phase rotation and at least one phase shift in a frequency response of the micromechanical actuator based on the detected test signal response, and
    the adapter adapts the at least one parameter of the controller based on at least one of the absolute position of the at least one mode, the relative position of the modes with respect to one another in the detected test signal response, and one of the identified phase rotation and the identified phase shift.

10. The device as recited in claim 9, wherein:
    the analyzer identifies in each case an attenuation factor for the modes based on the detected test signal response, and
    the adapter adapts the at least one parameter of the controller based on at least one of the absolute position of the at least one mode, the relative position of the modes with respect to one another in the detected test signal response, one of the identified phase rotation and the identified phase shift, and the attenuation factor.

11. The device as recited in claim 7, wherein:
    the signal generator acts on the micromechanical actuator, together with the controller in a closed control loop, with a test signal which has at least one of a step, a pulse, and a frequency sweep,
    the detector detects a system response of the micromechanical actuator together with the controller in the closed control loop, and
    the analyzer determines a system stability based on the system response.

* * * * *